US012666885B2

(12) United States Patent
Kim et al.

(10) Patent No.: US 12,666,885 B2
(45) Date of Patent: Jun. 23, 2026

(54) SYSTEMS AND METHODS FOR DEPOSITION OF MOLYBDENUM FOR SOURCE/DRAIN CONTACTS

(71) Applicant: ASM IP HOLDING B.V., Almere (NL)

(72) Inventors: Jiyeon Kim, Tempe, AZ (US); Petri Raisanen, Gilbert, AZ (US); Dong Li, Phoenix, AZ (US); Eric James Shero, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 465 days.

(21) Appl. No.: 18/121,064

(22) Filed: Mar. 14, 2023

(65) Prior Publication Data

US 2023/0298902 A1 Sep. 21, 2023

Related U.S. Application Data

(60) Provisional application No. 63/269,530, filed on Mar. 17, 2022.

(51) Int. Cl.
| | |
|---|---|
| *H10P 14/40* | (2026.01) |
| *H10D 64/01* | (2025.01) |
| *H10P 14/43* | (2026.01) |
| *H10P 70/00* | (2026.01) |

(52) U.S. Cl.
CPC ........... *H10P 14/412* (2026.01); *H10D 64/01* (2025.01); *H10P 14/43* (2026.01); *H10P 70/12* (2026.01)

(58) Field of Classification Search
None
See application file for complete search history.

(56) References Cited

U.S. PATENT DOCUMENTS

| | | |
|---|---|---|
| 5,980,977 A | 11/1999 | Deng |
| 8,785,310 B2 | 7/2014 | Hasegawa |
| 10,734,497 B2 | 8/2020 | Zhu |

(Continued)

FOREIGN PATENT DOCUMENTS

| | | |
|---|---|---|
| JP | 2020029616 A | 2/2020 |
| JP | 2020029617 A | 2/2020 |

(Continued)

*Primary Examiner* — Alexander G Ghyka
(74) *Attorney, Agent, or Firm* — Snell & Wilmer L.L.P.

(57) ABSTRACT

Disclosed herein are systems and methods method for thin film deposition of molybdenum for source/drain formation. A deposition process may be performed in which the surface is contacted in the reaction chamber with a first oxygen-free molybdenum halide reactant at a first temperature, wherein said contacting with the first oxygen-free molybdenum halide reactant forms at least one layer of molybdenum on the substrate. In some embodiments, the temperature of the reaction chamber may be raised from the first temperature to a second temperature. In some embodiments, the substrate in the reaction chamber may be contacted with a second oxygen-free molybdenum halide reactant at the second temperature, wherein said contacting with the second oxygen-free molybdenum halide reactant forms at least one layer of molybdenum on the substrate. In some embodiments, the deposition at the second temperature may be repeated until a molybdenum-containing film of desired thickness is formed.

19 Claims, 4 Drawing Sheets

Provide Substrate in Reaction Chamber — 150

Remove Surface Oxide with Etchant — 152

Remove Etchant Residue — 154

Contact Substrate with First Reactant at First Temperature — 156

Raise Temperature of Reaction Chamber to Second Temperature — 158

Contact Substrate with Second Reactant at Second Temperature — 160

Form Thin Film on Substrate — 162

(56)          References Cited

U.S. PATENT DOCUMENTS

| | | | |
|---|---|---|---|
| 11,286,558 B2 | 3/2022 | Stevens | |
| 11,295,980 B2 | 4/2022 | Zope | |
| 2014/0196746 A1* | 7/2014 | Dinsmore | ......... H01L 21/02063 |
| | | | 134/1.1 |
| 2019/0067003 A1 | 2/2019 | Zope | |
| 2019/0067014 A1 | 2/2019 | Shrestha | |
| 2021/0348271 A1 | 11/2021 | Mishra | |
| 2021/0407809 A1 | 12/2021 | Zope | |
| 2022/0018016 A1 | 1/2022 | Ma | |
| 2022/0262640 A1 | 8/2022 | Jandl | |
| 2022/0380897 A1 | 12/2022 | Bhatnagar | |

FOREIGN PATENT DOCUMENTS

| | | | |
|---|---|---|---|
| KR | 20210024418 A | 3/2021 | |
| WO | 9814970 A1 | 4/1998 | |
| WO | 2019143632 A1 | 7/2019 | |
| WO | WO-2021046058 A1 * | 3/2021 | ....... H01L 21/76879 |
| WO | 2021239596 A1 | 12/2021 | |

* cited by examiner

150 Provide Substrate in Reaction Chamber

152 Remove Surface Oxide with Etchant

154 Remove Etchant Residue

156 Contact Substrate with First Reactant at First Temperature

158 Raise Temperature of Reaction Chamber to Second Temperature

160 Contact Substrate with Second Reactant at Second Temperature

162 Form Thin Film on Substrate

SYSTEMS AND METHODS FOR DEPOSITION OF MOLYBDENUM FOR SOURCE/DRAIN CONTACTS

CROSS-REFERENCE TO RELATED APPLICATIONS

This application is a nonprovisional of, and claims priority to and the benefit of, U.S. Provisional Patent Application No. 63/269,530, filed Mar. 17, 2022 and entitled "SYSTEMS AND METHODS FOR DEPOSITION OF MOLYBDENUM FOR SOURCE/DRAIN CONTACTS," which is hereby incorporated by reference herein.

BACKGROUND

Field

The embodiments herein are generally related to semiconductor processing systems and methods, particularly for deposition of molybdenum.

Description

Semiconductor devices are electronic components that exploit the electrical properties of semiconductor materials, such as silicon (Si), germanium (Ge), and silicon germanium (SiGe). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. In instances where the charge carriers are electrons, the FET is referred to as an n-channel device, and in instances where the charge carriers are holes, the FET is referred to as a p-channel device. Some FETs have a fourth terminal called the body or substrate, which can be used to bias the transistor. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (p-MOS) and n-channel MOSFET (n-MOS) to implement logic gates and other digital circuits.

Many existing solutions for forming source/drain contacts for semiconductor device fabrication use physical vapor deposition (PVD) techniques. PVD cannot provide conformal depositions on complex structures as the deposition often causes surface damage during the deposition process. Several atomic layer deposition (ALD) and chemical vapor deposition (CVD) processes have been developed as alternatives to PVD process for forming source/drain contacts. However, these processes have been found to form oxides at the interface with a substrate, which may result in undesirable source/drain properties, such as high contact resistance. Furthermore, deposition processes for forming molybdenum films for source/drain applications utilizing halide reactants have typically had the disadvantage of etching the substrate surface or contaminating other materials. Thus, novel systems and methods for source/drain deposition are needed.

SUMMARY

For purposes of this summary, certain aspects, advantages, and novel features of the invention are described herein. It is to be understood that not all such advantages necessarily may be achieved in accordance with any particular embodiment of the invention. Thus, for example, those skilled in the art will recognize that the invention may be embodied or carried out in a manner that achieves one advantage or group of advantages as taught herein without necessarily achieving other advantages as may be taught or suggested herein.

Some embodiments herein are directed to methods for thin film deposition, the method comprising: providing a substrate in a reactor; performing a surface clean on a surface of the substrate; performing a deposition process comprising: a) contacting the surface of the substrate in the reactor with a first oxygen-free molybdenum halide reactant at a first temperature, wherein contacting with the first oxygen-free molybdenum halide reactant forms at least one layer of molybdenum on the substrate; b) raising the temperature of the reactor from the first temperature to a second temperature; c) contacting the substrate in the reactor with a second oxygen-free molybdenum halide reactant at the second temperature, wherein contacting with the second oxygen-free molybdenum halide reactant forms at least one layer of molybdenum on the substrate; and repeating step c) until a molybdenum-containing film of desired thickness is formed.

In some embodiments, the first oxygen-free molybdenum halide reactant and the second oxygen-free molybdenum halide reactant comprise $MoCl_5$. In some embodiments, $MoCl_5$ is continuously flowed into the reactor during the deposition process. In some embodiments, the temperature of the reactor is raised while the substrate is contacted with the first oxygen-free molybdenum halide reactant and/or the second oxygen-free molybdenum halide reactant. In some embodiments, the deposition process further comprises ceasing contacting the surface of the substrate in the reactor with the first oxygen-free molybdenum halide reactant prior to raising the temperature of the reactor from the first temperature to the second temperature.

In some embodiments, the surface clean comprises removing a surface oxide from the surface of the substrate by contacting the surface with an etchant. In some embodiments, the surface clean further comprise removing an etchant residue from the surface.

In some embodiments, the surface of the substrate is contacted with the first oxygen-free molybdenum halide reactant in a first reaction chamber of the reactor and contacted with the second oxygen-free molybdenum halide reactant in a second reaction chamber of the reactor, wherein the first reaction chamber is in gas isolation from the second reaction chamber.

In some embodiments, the molybdenum-containing film of desired thickness is between 1 nm and 100 nm. In some embodiments, the molybdenum-containing film of desired thickness comprises a resistivity of less than about 50 $\mu\Omega$cm, less than about 30 $\mu\Omega$cm, or less than about 20 $\mu\Omega$cm. In some embodiments, the molybdenum-containing film of desired thickness comprises a three-dimensional structure having at least 90%, or 95% or higher conformality. In some embodiments, the molybdenum-containing film of desired thickness forms a structure having an aspect ratio of more than about 3:1 and wherein the film has step coverage of more than about 80%, more than about 90%, or more than about 95%. In some embodiments, the molybdenum-containing film of desired thickness forms a structure having an aspect ratio of more than about 5:1. In some embodiments, the molybdenum-containing film of desired thickness forms a structure having an aspect ratio of more than about 10:1.

In some embodiments, the first temperature is less than 400° C. In some embodiments, the second temperature is greater than 450° C. In some embodiments, the deposition process comprises atomic layer deposition (ALD) on the substrate.

In some embodiments, the molybdenum-containing film of desired thickness comprises a source or drain contact structure of a field effect transistor. In some embodiments, the surface comprises silicon, germanium, or silicon germanium.

Some embodiments herein are directed to a substrate processing system, comprising: a reaction chamber for accommodating one or more substrates; a control unit comprising one or more processors and non-transitory computer-readable media storing instructions for controlling the substrate processing system, wherein the instructions, when executed by the one or more processors, cause the substrate processing system to: provide a substrate in the reactor; perform a surface clean of a surface of the substrate; perform a deposition process comprising: a) contact the surface of the substrate in the reactor with a first oxygen-free molybdenum halide reactant at a first temperature, wherein said contacting with the first oxygen-free molybdenum halide reactant forms at least one layer of molybdenum on the substrate; b) raise the temperature of the reactor from the first temperature to a second temperature; c) contact the substrate in the reactor with a second oxygen-free molybdenum halide reactant at the second temperature, wherein said contacting with the second oxygen-free molybdenum halide reactant forms at least one layer of molybdenum on the substrate, wherein the second temperature is higher than the first temperature; and repeat step c) until a molybdenum-containing film of desired thickness is formed.

BRIEF DESCRIPTION OF THE DRAWINGS

The drawings are provided to illustrate example embodiments and are not intended to limit the scope of the disclosure. A better understanding of the systems and methods described herein will be appreciated upon reference to the following description in conjunction with the accompanying drawings, wherein.

DETAILED DESCRIPTION

Figure 1:
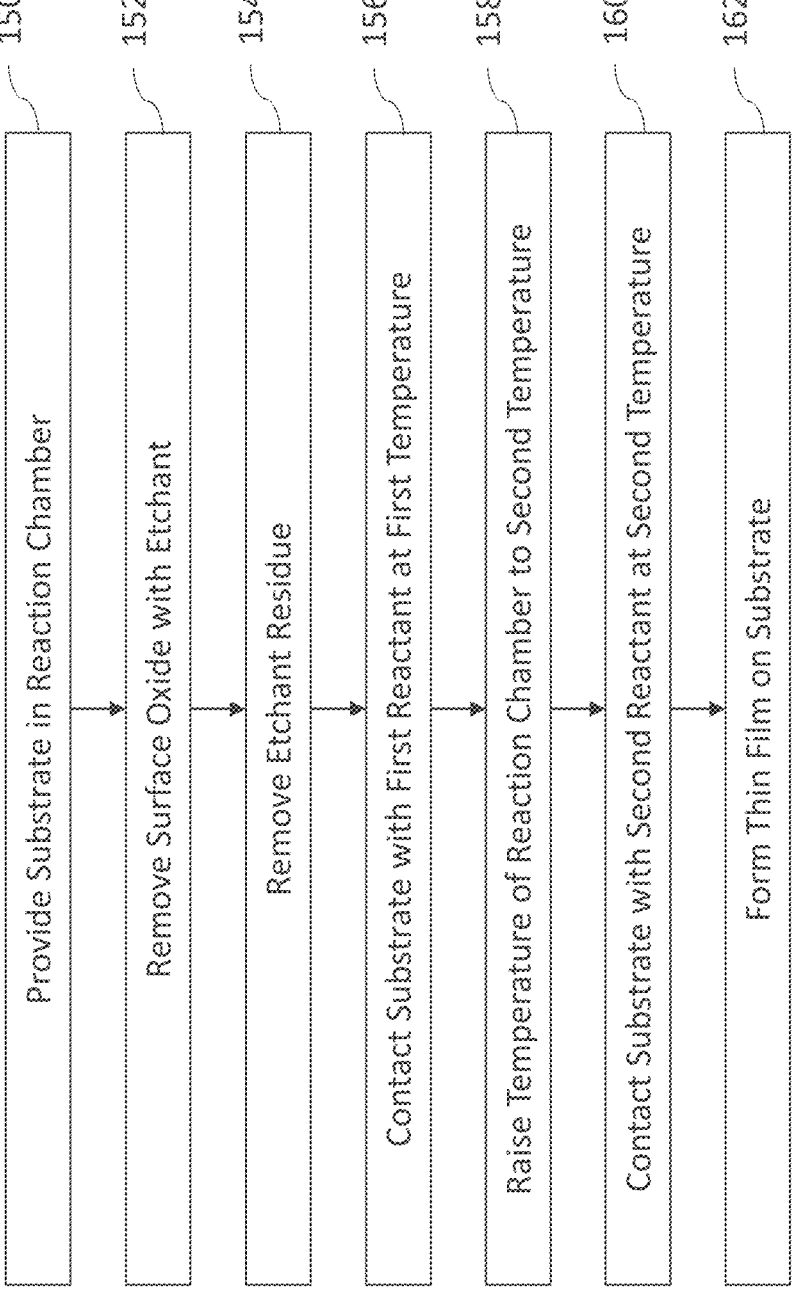
FIG. 1 illustrates a flowchart of an example method for thin film deposition according to some embodiments herein.

Although certain preferred embodiments and examples are disclosed below, inventive subject matter extends beyond the specifically disclosed embodiments to other alternative embodiments and/or uses and to modifications and equivalents thereof. Thus, the scope of the claims appended hereto is not limited by the embodiments described below. For example, in any method or process disclosed herein, the acts or operations of the method or process may be performed in any suitable sequence and are not necessarily limited to any disclosed sequence. Various operations may be described as multiple discrete operations in turn, in a manner that may clarify certain embodiments; however, the order of description should not be construed to imply that these operations are order dependent. Additionally, the structures, systems, and/or devices described herein may be embodied as integrated components or as separate components. For purposes of comparing various embodiments, certain aspects and advantages of these embodiments are described. Not necessarily all such aspects or advantages are achieved by any embodiment. Thus, for example, various embodiments may be carried out in a manner that achieves one advantage or group of advantages as taught herein without necessarily achieving other aspects or advantages as may also be taught or suggested herein.

Certain example embodiments will now be described to provide an overall understanding of the principles of the structure, function, manufacture, and use of the devices and methods disclosed herein. One or more examples of these embodiments are illustrated in the accompanying drawings. Those skilled in the art will understand that the devices and methods specifically described herein and illustrated in the accompanying drawings are non-limiting example embodiments and that the scope of the present invention is defined solely by the claims. The features illustrated or described in connection with one example embodiment may be combined with the features of other embodiments. Such modifications and variations are intended to be included within the scope of the present technology.

As used herein, the term "substrate" may refer to any underlying material or materials, including any underlying material or materials that may be modified, and/or upon which, a device, a circuit, or a film may be formed. The "substrate" may be continuous or non-continuous; rigid or flexible; solid or porous; and combinations thereof. The substrate may be in any form, such as a powder, a plate, or a workpiece. Substrates in the form of a plate may include wafers in various shapes and sizes. Substrates may be made from semiconductor materials, including, for example, silicon, silicon germanium, silicon oxide, gallium arsenide, gallium nitride and silicon carbide. A continuous substrate may extend beyond the bounds of a process chamber where a deposition process occurs. In some processes, the continuous substrate may move through the process chamber such that the process continues as the substrate moves, for example, until the end of the substrate is reached. A continuous substrate may be supplied from a continuous substrate feeding system to allow for manufacture and output of the continuous substrate in any appropriate form. Non-limiting examples of a continuous substrate may include a sheet, a non-woven film, a roll, a foil, a web, a flexible material, a bundle of continuous filaments, and fibers (for example, ceramic fibers or polymer fibers). In some embodiments, a plurality of discrete substrates may be processed in a similar manner as a continuous substrate by mounting the plurality of discrete substrates on the same carrier or sheet.

As the dimensions of semiconductor devices in integrated circuits become ever smaller, the sizes of the constituent parts of these devices are also becoming smaller. For example, the sizes of transistors are continually decreasing, leading to decreases in the sizes of transistor source/drain regions. These smaller source/drain regions provide a smaller contact area for the source/drain contacts that electrically connect the source/drain regions to other electrical features. Smaller contact areas, however, can cause undesirable increases in contact resistance.

Achieving low source/drain contact resistance is facilitated by depositing a metal film on an exposed substrate surface, such as a semiconductor wafer, without the formation of an interfacial oxide layer. Various embodiments herein are directed to systems and methods for depositing metal films, such as films comprising molybdenum, on an exposed substrate surface without or substantially without the formation of an interfacial oxide layer and without significant etching of the surface. Preferably, in some embodiments, the exposed substrate surface is the surface of a semiconductor region that forms a source/drain region for a transistor. For example, the source/drain region may be formed of an n-doped semiconductor.

In accordance with embodiments disclosed herein, source/drain contact structures may be formed having a low resistivity and high uniformity. In some embodiments, a source/drain contact structure may be formed by deposition of molybdenum films substantially without formation of an interfacial oxide. In some embodiments, the deposition may comprise atomic layer deposition (ALD) utilizing a molybdenum halide reactant. In some embodiments, the deposition may comprise forming a molybdenum film on complex three-dimensional structures formed on the surface of a substrate.

In some embodiments, a molybdenum halide reactant as used herein may comprise a monomeric structure. In some embodiments, a molybdenum halide reactant as used herein may not comprise oxygen.

In some embodiments, one or more source/drain contacts may be formed on the surface of a substrate by depositing a metal, such as molybdenum. In some embodiments, the deposition occurs in the absence of oxygen, as oxygen may form interfacial oxides on the surface, which can undesirably increase contact resistance. In some embodiments, the metal deposition comprises forming a molybdenum film using an oxygen-free molybdenum reactant. In some embodiments, the oxygen-free molybdenum reactant functions as a precursor for depositing molybdenum on a substrate.

In some embodiments, a source/drain structure with low contact resistance can be formed by depositing a metallic film without or substantially without interfacial oxide formation. In some embodiments, to deposit such a film, a surface oxide removal process followed by a metal deposition on the oxide-free surface may be performed. In some embodiments, the systems and methods for surface oxide removal and metal deposition herein result in a molybdenum (Mo) film deposition on an oxide-free surface. In some embodiments, the process comprises a surface clean treatment for native oxide removal followed by a metal deposition employing oxygen-free metal reactant. In some embodiments, no significant interfacial oxide is formed during the metal deposition.

In some embodiments, the surface clean treatment or surface oxide removal step comprises one or more of an oxide removal and an etchant residue removal. In some embodiments, without the etchant residue removal, a metallic film cannot be formed due to surface reactions that may occur between etching byproducts and the Mo reactants used during deposition.

In some embodiments, the oxide removal process may comprise contacting the substrate with Ar, which may be flowed to the reaction chamber at a rate of between about 0 slm and about 10 slm. In some embodiments, Ar may be flowed to the reaction chamber at a rate of about 3 slm. In some embodiments, the oxide removal process may comprise contacting the substrate with TT, which may be flowed to the reaction chamber at a rate of between about 0 slm and about 5 slm. In some embodiments, TT may be flowed to the reaction chamber at a rate of about 0.45 slm. In some embodiments, the oxide removal process may comprise contacting the substrate with $NF_3$, which may be flowed to the reaction chamber by a remote plasma unit at a rate between about 0 sccm and about 100 sccm. In some embodiments, the $NF_3$ may be flowed to the reaction chamber at a rate of about 10 sccm. In some embodiments, the oxide removal process may comprise contacting the substrate with $NH_3$, which may be flowed to the reaction chamber by a remote plasma unit at a rate between about 0 sccm and about 100 sccm. In some embodiments, the $NH_3$ may be flowed to the reaction chamber at a rate of about 50 sccm. In some embodiments, the oxide removal process may be conducted at a pressure between about 0 Torr to about 10 Torr for about 10 s to about 20 s, at a temperature of about 35° C. and about 50° C. In some embodiments, the oxide removal process may be conducted at a pressure of about 3 Torr. In some embodiments, during the oxide removal process, the oxide present on the surface of the substrate may be converted to $(NH_4)2SiF_6$ or $(NH_4)2GeF_6$. In some embodiments, after exposing the substrate to the oxide removal reactants (e.g., Ar, TT, $NH_3$, and/or $NF_3$) for about 10 s to about 20 s at a temperature of about 35° C. and about 50° C., the substrate may heated to a higher temperature to heat the wafer and evaporate the converted oxide product (e.g., $(NH_4)2SiF_6$ or $(NH_4)2GeF_6$). In some embodiments, after exposing the substrate to the oxide removal reactants (e.g., Ar, TT, $NH_3$, and/or $NF_3$) for about 10 s to about 20 s, the substrate may be moved in proximity to a heat source at about 225° C. In some embodiments, the substrate may be moved within about 2 mm to about 5 mm of the heat source in order to heat the substrate and evaporate the converted oxide product and clean the surface of the substrate.

In some embodiments, after completion of the oxide removal process, the substrate may undergo a hydrogen plasma treatment. In some embodiments, the hydrogen plasma treatment may comprise exposing the substrate to a $H_2$ and/or Ar plasma. In some embodiments, the hydrogen plasma treatment may comprise exposing the substrate to a plasma comprising about 10% to about 20% $H_2$. In some embodiments, the ratio of $H_2$:Ar may be about 1:10 to about 1:5. In some embodiments, Ar plasma may be flowed to the reaction chamber at about 7 slm, while $H_2$ plasma may be flowed to the reaction chamber at about 1 slm $H_2$. In some embodiments, the hydrogen plasma treatment may comprise exposing the substrate to a plasma for about 30 s to about 60 s. In some embodiments, during the hydrogen plasma treatment, the wafer may be held on lift pins between a susceptor and a heat source, wherein the susceptor is at a temperature between about 35° C. and about 50° C., and the heat source is maintained at about 225° C. In some embodiments, during the hydrogen plasma treatment, the wafer position may be maintained to fine tune the wafer temperature to minimize loss of Si, while moving any F from the surface of the substrate.

In accordance with some embodiments herein, methods of deposition, for example ALD are provided. The method can comprise providing a substrate with an exposed surface. The method can comprise contacting the entire substrate in a reactor with a first reactant at a first temperature so that no more than one monolayer of the first reactant is adsorbed on the exposed surface. Optionally, the contacting the entire substrate with a first reactant at a first temperature may be repeated until a film of desired thickness is deposited over the exposed surface. The method may comprise subsequently contacting the entire substrate with a second reactant at a second temperature different from the first temperature, so that no more than one monolayer of the second reactant is adsorbed on the exposed surface that adsorbed the first reactant. Optionally, the contacting the entire substrate with a second reactant at a second temperature may be repeated until a film of desired thickness is deposited over the exposed surface that adsorbed the first reactant. In some embodiments, each reactant substantially contacts the substrate at only one temperature, and, in some embodiments, two or more different reactants are contacted with the substrate at different temperatures.

In some embodiments, a metal deposition, such as an Mo deposition, may comprise an ALD and/or chemical vapor deposition (CVD) of Mo film. In some embodiments, the Mo deposition may comprise a temperature loading step in which one or more layers of Mo are deposited at a relatively low first temperature on the surface cleaned substrate surface. In some embodiments, the deposition of one or more layers of Mo at the relatively low first temperature may protect the surface cleaned substrate surface from damage/ etching. In some embodiments, the deposition may comprise a second deposition step comprising depositing one or more layers of Mo at a relatively high second temperature to achieve a low impurity Mo metallic film. In some embodiments, the second temperature may be higher than the first temperature. In some embodiments, the deposition of one or more layers of Mo at the second temperature may occur after the deposition of one or more layers of Mo at the first temperature. In some embodiments, the deposition may be completed in a single reaction chamber, and the temperature of the reaction chamber may be gradually raised from the first temperature to the second temperature while the Mo reactant is flowed into the reaction chamber.

In some embodiments, the deposition may comprise a two-step sequential deposition, in which a Mo reactant is first flowed into the reaction chamber at the first temperature. In some embodiments, after one or more layers of Mo are formed on the substrate surface, at the first temperature, the flow of Mo reactant may be stopped, and optionally the reaction chamber may be purged of Mo reactant. In some embodiments, the temperature of the reaction chamber and substrate surface may be raised to the second temperature in the absence of Mo reactant. In some embodiments, once the temperature of the reaction chamber has reached the second temperature, Mo reactant may be flowed into the reaction chamber to form one or more layers of Mo on the substrate surface until a film of sufficient thickness is formed.

In some embodiments, a reactor with multiple reaction chambers may be used to perform the deposition, in which the first reaction chamber may be maintained at the first temperature and a second reaction chamber may be maintained at a second temperature, and the substrate may be cycled between the reaction chambers to perform the sequential deposition steps. The reaction chambers can be in gas isolation from each other, such that each reaction chamber provides no more than one reactant, and so that no surface of any reaction chamber is contacted with more than one reactant. The first temperature can be different from the second temperature, and the first reactant can be provided in the first reaction chamber at the first temperature while the second reactant is provided in the second reaction chamber at the second temperature. Optionally, the first temperature is lower than the second temperature.

In some embodiments, the oxygen-free Mo reactant may comprise $MoCl_5$. However, in some embodiments, other oxygen-free reactants may be utilized. In some embodiments, a first Mo reactant may be used to deposit one or more layers of Mo on a substrate surface at a first temperature. In some embodiments, a second Mo reactant may be used to deposit one or more layers of Mo on a substrate a second temperature. In various deposition processes such as ALD, different reactants can have different temperature stabilities. Additionally, it is contemplated that some reactants will react more efficiently at certain temperatures or temperature ranges (e.g., a first reactant can be adsorbed more efficiently at a first temperature or temperature range, while a second reactant can be adsorbed more efficiently at a second temperature or temperature range). In some embodiments, the first Mo reactant and the second Mo reactant may be the same oxygen-free Mo reactant. In other embodiments, the first Mo reactant and the second Mo reactant may comprise different reactants.

In some embodiments, an Mo film of at least about 1 nm is deposited, for example 1 nm, 2, 3, 4, 5, 6, 7, 8, 9, 10, 15, 20, 25, 30, 35, 40, 45, 50, 60, 70, 80, 90, or 100 nm, including ranges between any two of the listed values, for example 1 nm-100 nm, 1 nm-20 nm, 1 nm-10 nm, 1 nm-5 nm, 2 nm-100 nm, 2 nm-20 nm, 2 nm-10 nm, 2 nm-5 nm, 5 nm-100 nm, 5 nm-20 nm, 5 nm-10 nm, 10 nm-100 nm, or 10 nm-20 nm.

As a practical matter, it is contemplated that in accordance with embodiments herein, there can be at least some temperature variation (even very small temperature variation) associated with providing or maintaining a reactant at a particular temperature. Accordingly, anywhere herein that mentions a first temperature that is different from a second temperature (or third temperature, fourth temperature, etc.), unless stated otherwise, a first temperature range that differs from the second temperature range is also expressly contemplated. Preferably, the first temperature range that differs from the second temperature range does not overlap with the second temperature range.

FIG. 1 illustrates a flowchart of an example method for thin film deposition according to some embodiments herein. In some embodiments, a substrate is provided in a reaction chamber of a reactor at 150. In some embodiments, the reactor may comprise a single reaction chamber. However, in some embodiments, the reactor may comprise multiple reaction chambers for performing surface clean steps and/or deposition steps. In some embodiments, the reactor comprises an ALD reactor.

In some embodiments, a surface oxide may be removed from an exposed surface of the substrate by contacting the surface with an etchant at 152. In some embodiments, the etchant may chemically react with the surface oxide to remove the surface oxide from the substrate. In some embodiments, the chemical reaction may form an etchant residue, which may remain on the surface after the oxide removal.

In some embodiments, the etchant residue may be removed from the surface at 154. Without being limited by theory, it is understood that without removing the etching byproducts from the surface of the substrate, a metallic film cannot be formed on the surface due to reactivity between the etching byproducts and the metal reactants used during deposition.

In some embodiments, a deposition process may be performed, either in the same reaction chamber as the surface clean, or in a separate reaction chamber. In some embodiments, the surface of the substrate in the reaction chamber may be contacted with a first oxygen-free molybdenum halide reactant at a first temperature at 156. In some embodiments, said contacting with the first oxygen-free molybdenum halide reactant forms at least one monolayer of molybdenum on the substrate. Optionally, the surface may be contacted with additional first oxygen-free molybdenum halide reactant to form one or more additional monolayers of molybdenum-containing film on the substrate. In some embodiments, the first temperature may be a relatively low temperature of less than 400° C. Although reactivity of the reactant may be lower at temperatures below 400° C., forming one or more initial layers of film using a low temperature deposition is understood to protect the exposed surface of the substrate from damage.

In some embodiments, the temperature of the reaction chamber may be raised from the first temperature to a second temperature at 158. In some embodiments, the second temperature may be above 450° C. up to about 650° C. In some embodiments, raising the temperature of the reaction chamber may increase reactivity of the deposition reactants and facilitate formation of a low-resistivity metallic film.

In some embodiments, the substrate in the reaction chamber may be contacted with a second oxygen-free molybdenum halide reactant at the second temperature at 160. In some embodiments, said contacting with the second oxygen-free molybdenum halide reactant forms at least one layer of molybdenum on the substrate. In some embodiments, the substrate may be repeatedly contacted, using temporally spaced reactant pulses, with the second oxygen-free molybdenum halide reactant at the second temperature until a molybdenum-containing film of desired thickness is formed at 162.

Atomic Layer Deposition

In accordance with some embodiments herein, a thin film can be deposited by Atomic Layer Deposition (ALD). A substrate can be placed in a reactor and contacted with a reactant at a temperature such that no more than a monolayer of the first reactant is adsorbed on the substrate. ALD type processes are based on controlled, self-limiting surface reactions of reactant chemicals. In accordance with some embodiments herein, gas phase reactions are avoided by alternately and sequentially contacting the substrate with the reactants at different temperatures. Vapor phase reactants are separated from each other, for example, by removing excess reactants and/or reactant byproducts from the reactor between reactant pulses.

Growth temperatures are generally maintained below the thermal decomposition temperature of the reactants but at a high enough level to avoid condensation of reactants and to provide the activation energy for the desired surface reactions. Of course, the appropriate temperature window for any given ALD reaction can depend upon the surface termination and reactant species involved. In accordance with some embodiments herein, the temperature varies depending on the reactant being contacted with the substrate and/or the type of film being deposited, for example at or below about 600° C., for example at or below 500° C., 475° C., 450° C., 425° C., 400° C., 375° C., 350° C., 325° C., 300° C., 275° C., 250° C., 225° C., 200° C., 175° C., 150° C., 125° C., 100° C., 75° C., 50° C., 40° C., 30° C., or 20° C., including ranges between any two of the listed values, for example, 20° C.-500° C., 20° C.-450° C., 20° C.-400° C., 20° C.-350, 20° C.-300° C., 20° C.-250° C., 20° C.-200° C., 20° C.-150° C., 20° C.-100° C., 20° C.-500° C., 50° C.-450° C., 50° C.-400° C., 50° C.-350, 50° C.-300° C., 50° C.-250° C., 50° C.-200° C., 50° C.-150° C., 50° C.-100° C., 100° C.-500° C., 100° C.-450° C., 100° C.-400° C., 100° C.-350° C., 100° C.-300° C., 100° C.-250° C., 100° C.-200° C., 100° C.-150° C., 200° C.-500° C., 200° C.-400° C., or 200° C.-300° C. In accordance with some embodiments herein, different reactants can have different temperature stabilities (e.g., the reactants can decompose at different temperatures and/or condense at different temperatures). By way of example, molybdenum-containing films, which can be deposited in accordance with some embodiments herein, can be deposited using one or more oxygen-free molybdenum halide reactants. It is contemplated that in accordance with some embodiments herein, a reaction for a first reactant (e.g., a first half reaction) is performed at a temperature suitable for the first reactant, and a reaction for a second reactant (e.g., a second half reaction) is performed at a temperature suitable for the second reactant.

It is contemplated that, in some embodiments, each reactant is provided in a reactor and contacts the substrate at an appropriate temperature so that the reactant is deposited while providing low levels of or eliminating condensation; providing low levels of, or eliminating thermal, decomposition; and/or providing low levels of or eliminating gas phase reactions by the reactant, so that substantially no gas phase reactions occur, and optionally substantially no particle formation occurs. In some embodiments, multiple reaction chambers of a reactor may be used for deposition, and only one kind of reactant is provided in each reaction chamber, and the different reactants in their respective different reaction chambers can be at different temperatures at the same time. Accordingly, in some embodiments, a substrate is contacted with a first reactant in a first reaction chamber at a first temperature or temperature range and is contacted with a second reactant in a second reaction chamber at a second temperature or temperature range that is different from the first temperature. Optionally, the first reaction chamber and the second reaction chamber are in gas isolation from each other when the substrate is contacted with each of the first and second reactants. Optionally, the first temperature is lower than the second temperature. Optionally, the first temperature is greater than the second temperature. In some embodiments, the first temperature differs from the second temperature by at least 1° C., for example at least 1° C., 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35 36, 37, 38, 39, 40, 41, 42, 43, 44, 45, 46, 47, 48, 49, 50, 55, 60, 65, 70, 75, 80, 85, 90, 95, 99, 100, 110, 105, 110, 115, 120, 125, 130, 135, 140, 145, 150, 155, 160, 165, 170, 175, 180, 185, 190, 195, 200, 210, 220, 230, 240, 250, 260, 270, 280, 290, or 300° C., including ranges between any two of the listed values, for example 1-10° C., 1-20° C., 1-30° C., 1-40° C., 1-50° C., 1-60° C., 1-70° C., 1-80° C., 1-90° C., 1-100° C., 1-150° C., 1-200° C., 2-10° C., 2-20° C., 2-30° C., 2-40° C., 2-50° C., 2-60° C., 2-70° C., 2-80° C., 2-90° C., 2-100° C., 2-150° C., 2-200° C., 5-10° C., 5-20° C., 5-30° C., 5-40° C., 5-50° C., 5-60° C., 5-70° C., 5-80° C., 5-90° C., 5-100° C., 5-150° C., 5-200° C., 10-20° C., 10-30° C., 10-40° C., 10-50° C., 10-60° C., 10-70° C., 10-80° C., 10-90° C., 10-100° C., 10-150° C., 10-200° C., 20-30° C., 20-40° C., 20-50° C., 20-60° C., 20-70° C., 20-80° C., 20-90° C., 20-100° C., 20-150° C., or 20-200° C. Optionally, a substrate is contacted with a first reactant in a reaction chamber at a first temperature or temperature range and is subsequently contacted with a second reactant in the same reaction chamber at a second temperature or temperature range that is different from the first temperature. In accordance with some embodiments herein, a reactant can be brought to an appropriate temperature or temperature range by a heated showerhead, a heated source vessel, a heated susceptor, a heated gas source line, a cooled source vessel, a cooled susceptor, a cooled gas source line, and/or heat energy from a pre-existing temperature in the reaction chamber. Optionally, the reaction chamber can comprise a heating and/or cooling system in thermal communication with the reaction chamber to bring the reaction chamber to a desired temperature. For example, the heating system can include a heater or heating element, a lamp, thermal tape, thermal coils, a cooling fan, a coolant coil, or any combination of two or more of the listed items.

In some embodiments, a plasma provides energy to drive a deposition reaction, and thus can permit the reaction to be performed at a lower temperature and/or faster speed than if it was driven only by thermal energy. Plasmas can be provided, for example, by a remote plasma generator, or in situ. In some embodiments, the first reactant is provided as a plasma or in conjunction with a plasma (e.g., for plasma enhanced CVD or ALD), and the second reactant is provided as a gas phase (e.g., for thermal deposition). In some embodiments, the first reactant is provided as a gas phase (e.g., for thermal deposition), and the second reactant is provided as a plasma or in conjunction with a plasma (e.g., for plasma enhanced CVD or ALD). In some embodiments, the first reactant and second reactant are each provided as a gas phase (e.g., for thermal deposition). In some embodiments, the first reactant is provided as a plasma or in conjunction with a plasma (e.g., for plasma enhanced CVD or ALD), and the second reactant is provided as a plasma or in conjunction with a plasma (e.g., for plasma enhanced CVD or ALD).

The terms "wafer" and "substrate" are used interchangeably herein. The surface of the substrate can be contacted with a vapor phase first reactant. In some embodiments, a pulse of vapor phase first reactant is provided to a reaction chamber containing the substrate. In some embodiments, the substrate is moved to a reaction chamber where vapor phase first reactant is provided. Preferably, the vapor phase first reactant is not present in the reaction chamber when the substrate is moved to the reaction chamber, and the vapor phase first reactant is subsequently provided in the reaction chamber. In some embodiments, the vapor phase first reactant is already present in the reaction chamber when the substrate is moved to the reaction chamber. Optionally, some vapor phase first reactant is already present in the reaction chamber when the substrate is placed in the reaction chamber, and additional vapor phase second reactant is added to the reaction chamber thereafter. Conditions are preferably selected such that no more than about one monolayer of the vapor phase first reactant is adsorbed on the substrate surface in a self-limiting manner. The appropriate contacting times can be readily determined by the skilled artisan based on the circumstances. Excess vapor phase first reactant and reaction byproducts, if any, may be removed from the substrate surface, such as by purging with an inert gas, evacuation of gases from the proximity of the substrate, or by removing the substrate from the presence of the vapor phase first reactant. In accordance with some embodiments herein, the vapor phase first reactant is contacted with a substrate in a reaction chamber at an appropriate temperature so that substantially no gas phase reactions of the vapor phase first reactant occur (or no gas phase reactions of the vapor phase first reactant occur), substantially no particle formation occurs, or particle formation is eliminated, and/or substantially no condensation of the vapor phase first reactant (or no condensation of the reactant) occurs. In some embodiments, the vapor phase first reactant is provided into the reaction chamber at the appropriate temperature, and the reaction chamber is also at this temperature. In some embodiments, the vapor phase first reactant is provided into the reaction chamber at the appropriate temperature, and the substrate is on a susceptor that is also at this temperature. In some embodiments, the vapor phase first reactant is provided at the appropriate temperature, and the reaction chamber is at a different temperature. For example, the vapor phase first reactant can be provided through a heated showerhead to be provided at a higher temperature than the temperature in the rest of the reaction chamber. In some embodiments, the vapor phase first reactant is provided in a reaction chamber, and in the reaction chamber the vapor phase reactant is heated or cooled to the appropriate temperature for contacting the substrate with the vapor phase first reactant, for example based on temperature in the rest of the reaction chamber, and/or the temperature of the susceptor on which the substrate is positioned.

"Purging" means that vapor phase reactants and/or vapor phase byproducts are removed from the substrate surface such as by evacuating a reaction chamber with a vacuum pump and/or by replacing the gas inside a reactor with an inert gas such as argon or nitrogen. Typical purging times (and suitable in accordance with some embodiments herein) are from about 0.05 to 20 seconds, more preferably between about 1 and 10 seconds, and still more preferably between about 1 and 2 seconds. However, other purge times can be utilized if necessary, such as where highly conformal step coverage over extremely high aspect ratio structures or other structures with complex surface morphology is needed, for example purge times of at least 20 seconds, for example at least 20 seconds, 25 seconds, 30 seconds, 40 seconds, or 50 seconds, including ranges between any two of the listed values.

The surface of the substrate can be contacted with a vapor phase second reactant at a second temperature that is different from the temperature at which the vapor phase first reactant contacts the substrate. In some embodiments, a pulse of a vapor phase second reactant is provided to a reaction chamber containing the substrate. In some embodiments, the substrate is moved to a reaction chamber where the vapor phase second reactant is provided. Optionally, the vapor phase second reactant is already present in the reaction chamber when the substrate is placed in the reaction chamber. Optionally, the vapor phase second reactant is not present in the reaction chamber when the substrate is placed in the reaction chamber, and the vapor phase second reactant is subsequently added to the reaction chamber. Optionally, the vapor phase second reactant can be added to the reaction chamber at an appropriate temperature that is either the same or different than the temperature of the rest of the reaction chamber. Optionally the vapor phase second reactant can contact the substrate at a second temperature while a different substrate in a different reaction chamber is contacted with the vapor phase first reactant at a first temperature that is different from the second temperature. Optionally, some vapor phase second reactant is already present in the reaction chamber when the substrate is placed in the reaction chamber, and additional vapor phase second reactant is added to the reaction chamber thereafter. Excess vapor phase second reactant and gaseous byproducts of the surface reaction, if any, are removed from the substrate surface. The steps of contacting and removing are repeated until a thin film of the desired thickness has been selectively formed on the first surface of substrate, with each cycle leaving no more than a molecular monolayer. Additional phases comprising alternately and sequentially contacting the surface of a substrate with other reactants can be included to form more complicated materials, such as ternary materials.

As described herein, each phase of each cycle is preferably self-limiting. An excess of reactants is supplied in each phase to saturate the susceptible structure surfaces. Surface saturation ensures reactant occupation of all available reactive sites (subject, for example, to physical size or "steric hindrance" restraints) and thus ensures excellent step coverage. Typically, no more than one molecular layer of material is deposited with each cycle (or less than one molecular layer of material is deposited with each cycle). However, in some embodiments more than one molecular layer can be deposited during the cycle.

Removing excess reactants can include evacuating some of the contents of a reaction chamber and/or purging a reaction chamber with helium, nitrogen or another inert gas. In some embodiments, purging comprises turning off the flow of the reactive gas while continuing to flow an inert carrier gas to the reaction chamber.

The reactants employed in the ALD type processes may be solid, liquid or gaseous materials under standard conditions (room temperature and atmospheric pressure), provided that the reactants are in vapor phase before they are contacted with the substrate surface. Contacting a substrate surface with a vaporized reactant means that the reactant vapor is in contact with the substrate surface for a limited period of time. Typically, the contacting time is from about 0.05 to 10 seconds. However, depending on the substrate type and its surface area, the contacting time may be even higher than 10 seconds. Contacting times can be on the order of minutes in some cases. The optimum contacting time can be determined by the skilled artisan based on the circumstances.

In accordance with some embodiments herein, a first vapor phase reactant can be contacted with the substrate at a first temperature, and a second vapor phase reactant can be contacted with the substrate at a second temperature that is different from the first temperature. Each vapor phase reactant can be at the appropriate temperature prior to contacting the substrate (e.g., if the reactant is provided by a heated showerhead or if an entire reaction chamber is at the appropriate temperature), or upon contacting the substrate (e.g., if the susceptor is heated to bring the substrate to the appropriate temperature).

The mass flow rate of the reactants can also be determined by the skilled artisan. In some embodiments, the flow rate of metal reactants is preferably between about 1 sccm and 1000 sccm without limitation, more preferably between about 100 sccm and 500 sccm. Example mass flow rates in accordance with some embodiments herein include at least 1 sccm, for example at least 10 sccm, 50 sccm, 100 sccm, 200 sccm, 300 sccm, 400 sccm, 500 sccm, 600 sccm, 700 sccm, 800 sccm, 900 sccm, or 1000 sccm, including ranges between any two of the listed values.

The pressure in a reaction chamber is typically from about 0.01 to about 20 mbar, more preferably from about 1 mbar to about 10 mbar, for example about 1 mbar, about 2 mbar, about 3 mbar, about 4 mbar, about 5 mbar, about 6 mbar, about 7 mbar, about 8 mbar, about 9 mbar, or about 10 mbar, including ranges between any two of the listed values. However, in some cases the pressure will be higher or lower than this range, as can be determined by the skilled artisan given the circumstances.

Before starting the deposition of the film, the substrate may be heated to a suitable growth temperature. In some embodiments, the substrate is placed on a heated susceptor. Optionally, the susceptor can have a lower mass than the substrate. Without being limited by any theory, it is contemplated that a susceptor with a lower mass than the substrate can arrive at a desired temperature more quickly than the substrate. As such, the substrate will spend less time at a different temperature, for example a temperature at which a reactant may condense, decompose, and/or react with the surface of the susceptor. The growth temperature varies depending on the type of thin film formed, physical properties of the reactants, etc. The growth temperature can be less than the crystallization temperature for the deposited materials such that an amorphous thin film is formed, or it can be above the crystallization temperature such that a crystalline thin film is formed. The preferred growth temperature may vary depending on several factors such as, and without limitation, the reactants, the pressure, flow rate, the arrangement of the reactor, crystallization temperature of the deposited thin film, and the composition of the substrate including the nature of the material to be deposited on. The specific growth temperature may be selected by the skilled artisan. In some embodiments, the first and second reactants for an ALD reaction have the same growth temperature. In some embodiments, the first and second reactants for the ALD reaction have different growth temperatures. Optionally, the first reactant has a higher growth temperature than the second reactant. Optionally, the first reactant has a lower growth temperature than the second reactant. ALD in accordance with some embodiments herein can comprise thermal ALD. ALD in accordance with some embodiments herein can comprise thermal plasma-assisted ALD or plasma-enhanced ALD (PEALD).

In some embodiments, the reactor may be a single-wafer ALD reactor or a batch ALD reactor, where deposition on multiple substrates takes place at the same time. In some embodiments, the substrate on which deposition is desired, such as a semiconductor wafer, is loaded into a reactor. The reactor may be part of a cluster tool in which a variety of different processes in the formation of an integrated circuit are carried out. In some embodiments a flow-type reactor is utilized. In some embodiments a high-volume manufacturing-capable single-wafer ALD reactor is used.

Examples of suitable reactors that may be used include commercially available ALD equipment. In addition to ALD reactors, many other kinds of reactors capable of ALD growth of thin films, including CVD reactors equipped with appropriate equipment and means for pulsing the reactants can be employed. In some embodiments, a flow type ALD reactor is used. Preferably, reactants are kept separate until reaching the reaction chamber, such that shared lines for the reactants are minimized. However, other arrangements are possible.

In some embodiments, batch reactors are utilized. In some embodiments in which a batch reactor is used, wafer-to-wafer uniformity is less than 3% (1 sigma), less than 2%, less than 1% or even less than 0.5%.

The deposition processes described herein can optionally be carried out in a reactor or reaction chamber connected to a cluster tool. In a cluster tool, because each reaction chamber is dedicated to one type of process, the temperature of the reaction chamber in each module can be kept constant, which can improve the throughput compared to a reactor in which the substrate is heated up to the process temperature before each run.

In some embodiments, a reactant in a reactor or reaction chamber is delivered via a showerhead. Optionally, the showerhead comprises a heated showerhead to provide the reactant to the reaction chamber at a desired temperature or range of temperatures. In some embodiments, the heated showerhead provides the reactant to the reaction chamber at or near the temperature at which the reactant contacts the substrate. Optionally, the showerhead comprises a vacuum exhaust scavenger around its perimeter to capture excess reactant, and to minimize the amount of reactant that is potentially available to participate in CVD reactions with other reactants.

Chemical Vapor Deposition

In some embodiments, a thin film or a portion of a thin film is deposited by chemical vapor deposition (CVD) using one or more reactants described herein. For example, in some embodiments, a film can be deposited by CVD prior to one or more cycles of ALD over the CVD-produced film, and/or following one or more cycles of ALD. For example, in some embodiments, CVD is performed on a desired substrate, but ALD is not. Deposition can be suitably conducted according to the various CVD methods. CVD methods are described, for example, in U.S. Pat. No. 7,438,760, which is incorporated by reference in its entirety herein. The disclosed methods in accordance with some embodiments herein can be suitably practiced by employing CVD. In some embodiments, the CVD is thermal. In some embodiments, the CVD comprises plasma-enhanced chemical vapor deposition (PECVD).

The CVD reactant and, optionally two or more reactants including an etchant gas and/or an electrical dopant reactant, are preferably introduced to the reaction chamber in the form of separate gases or by intermixing to form a feed gas. The intermixing to form the feed gas may take place in the chamber or prior to introduction of the feed gas to the chamber. The total pressure in the CVD chamber is preferably in the range of about $10^{-5}$ Torr to about 1000 Torr, more preferably in the range of about $10^{-4}$ Torr to about atmospheric pressure, for example about 760 Torr. In some embodiments, the chemical vapor deposition conditions comprise a chamber pressure of at least about $10^{-5}$ Torr, preferably a chamber pressure of about 760 Torr or less, for example a pressure of about 760 Torr, 740 Torr, 720 Torr, 700 Torr, 680 Torr, 660 Torr, 640 Torr, 620 Torr, 600 Torr, 580 Torr, 560 Torr, 540 Torr, 520 Torr, 500 Torr, 480 Torr, 460 Torr, 440 Torr, 420 Torr, 400 Torr, 350 Torr, 300 Torr, 250 Torr, 200 Torr, 150 Torr, or less, or a pressure in the range of about $10^{-4}$ Torr to about 760 Torr, for example about $10^{-4}$ Torr, $10^{-3}$ Torr, $10^{-2}$ Torr, $10^{-1}$ Torr, 1 Torr, 5 Torr, 10 Torr, 30 Torr, 50 Torr, 100 Torr, 150 Torr, 200 Torr, 250 Torr, 300 Torr, 350 Torr, 400 Torr, 450 Torr, 500 Torr, 600 Torr, 650, 700 Torr, 750 Torr, or 760 Torr, including ranges between any two of the listed values. The chamber pressure may be referred to herein as a deposition pressure. The partial pressure of reactant is preferably in the range of about 0.0001% to about 100% of the total pressure, more preferably about 0.001% to about 50% of the total pressure. In some embodiments, the temperature of the CVD reaction chamber is about 600° C. or less, for example about 550° C. or less. In some embodiments, the temperature of the reaction chamber is about 500° C. or less, for example, less than 500° C., 490° C., 480° C., 470° C., 460° C., 450° C., 440° C., 430° C., 420° C., 410° C., 400° C., 375° C., 350° C., 325° C., or 300° C. or less, including ranges between any two of the listed values.

In some embodiments, if CVD and ALD are both performed, the CVD is performed at a different temperature than ALD. For example, a CVD reactant can have a different thermal stability and/or condensation temperature than one or more of the ALD reactants.

Thin Film Characteristics

Thin films deposited according to some of the embodiments described herein may be continuous thin films comprising molybdenum. In some embodiments, the thin films comprising molybdenum may be continuous at a thickness below about 100 nm, below about 60 nm, below about 50 nm, below about 40 nm, below about 30 nm, below about 25 nm, or below about 20 nm or below about 15 nm or below about 10 nm or below about 5 nm or lower. The continuity referred to can be physically continuity or electrical continuity. In some embodiments, the thickness at which a film may be physically continuous may not be the same as the thickness at which a film is electrically continuous, and the thickness at which a film may be electrically continuous may not be the same as the thickness at which a film is physically continuous.

While in some embodiments, a thin film comprising molybdenum deposited according to some of the embodiments described herein may be continuous, in other embodiments it may be desirable to form a non-continuous thin film comprising molybdenum, or a thin film comprising separate islands or nanoparticles comprising molybdenum. In some embodiments, the deposited thin film comprising molybdenum may comprise nanoparticles comprising molybdenum that are not substantially physically or electrically continuous with one another. In some embodiments, the deposited thin film comprising molybdenum may comprise separate nanoparticles, or separate islands, comprising molybdenum.

In some embodiments, a thin film comprising molybdenum deposited according to some of the embodiments described herein may have a resistivity of less than about 20 μΩcm at a thickness of less than about 100 nm. In some embodiments, a thin film comprising molybdenum deposited according to some of the embodiments described herein may have a resistivity of less than about 20 μΩcm at a thickness of below about 60 nm, below about 50 nm, below about 40 nm, below about 30 nm, below about 25 nm, or below about 20 nm or lower. In some embodiments, a thin film comprising molybdenum deposited according to some of the embodiments described herein may have a resistivity of less than about 15 μΩcm at a thickness of below about 60 nm, below about 50 nm, below about 40 nm, below about 30 nm, below about 25 nm, or below about 20 nm or lower. In some embodiments, a thin film comprising molybdenum deposited according to some of the embodiments described herein may have a resistivity of less than about 10 μΩcm at a thickness of below about 60 nm, below about 50 nm, below about 40 nm, below about 30 nm, below about 25 nm, or below about 20 nm or lower. In some embodiments, a thin film comprising molybdenum deposited according to some of the embodiments described herein may have a resistivity of less than about 200 μΩcm at a thickness of below about 30 nm, below about 20 nm, below about 15 nm, below about 10 nm, below about 8 nm, or below about 5 nm or lower.

In some embodiments, a thin film comprising molybdenum deposited according to some of the embodiments described herein may have a resistivity of less than about 200 μΩcm, less than about 100 μΩcm, less than about 50 μΩcm, less than about 30 μΩcm, less than about 20 μΩcm, less than about 18 μΩcm, less than about 15 μΩcm, less than about 12 μΩcm, less than about 10 μΩcm, less than about 8 μΩcm, or less than about 5 μΩcm or lower at a thickness of less than about 100 nm. In some embodiments a thin film comprising molybdenum deposited according to some of the embodiments described herein may have a resistivity of less than about 20 μΩcm, less than about 18 μΩcm, less than about 15 μΩcm, less than about 12 μΩcm, less than about 10 μΩcm, less than about 8 μΩcm, or less than about 5 μΩcm or lower at a thickness of less than about 50 nm.

Atomic layer deposition allows for conformal deposition of Mo films. In some embodiments, the Mo films deposited by the processes disclosed herein on a three-dimensional structure have at least 90%, 95% or higher conformality. In some embodiments, the films are about 100% conformal.

In some embodiments, the Mo film formed has step coverage of more than about 80%, more preferably more than about 90%, and most preferably more than about 95% in structures which have high aspect ratios. In some embodiments, high aspect ratio structures have an aspect ratio that is more than about 3:1 when comparing the depth or height to the width of the feature. In some embodiments, the structures have an aspect ratio of more than about 5:1, or even an aspect ratio of 10:1 or greater.

In some embodiments, following deposition of the molybdenum films, such as Mo, a further film is deposited. In some embodiments, the additional film may be directly over and contacting the molybdenum film, such as directly over and contacting a Mo layer.

EXAMPLES

Figure 2:
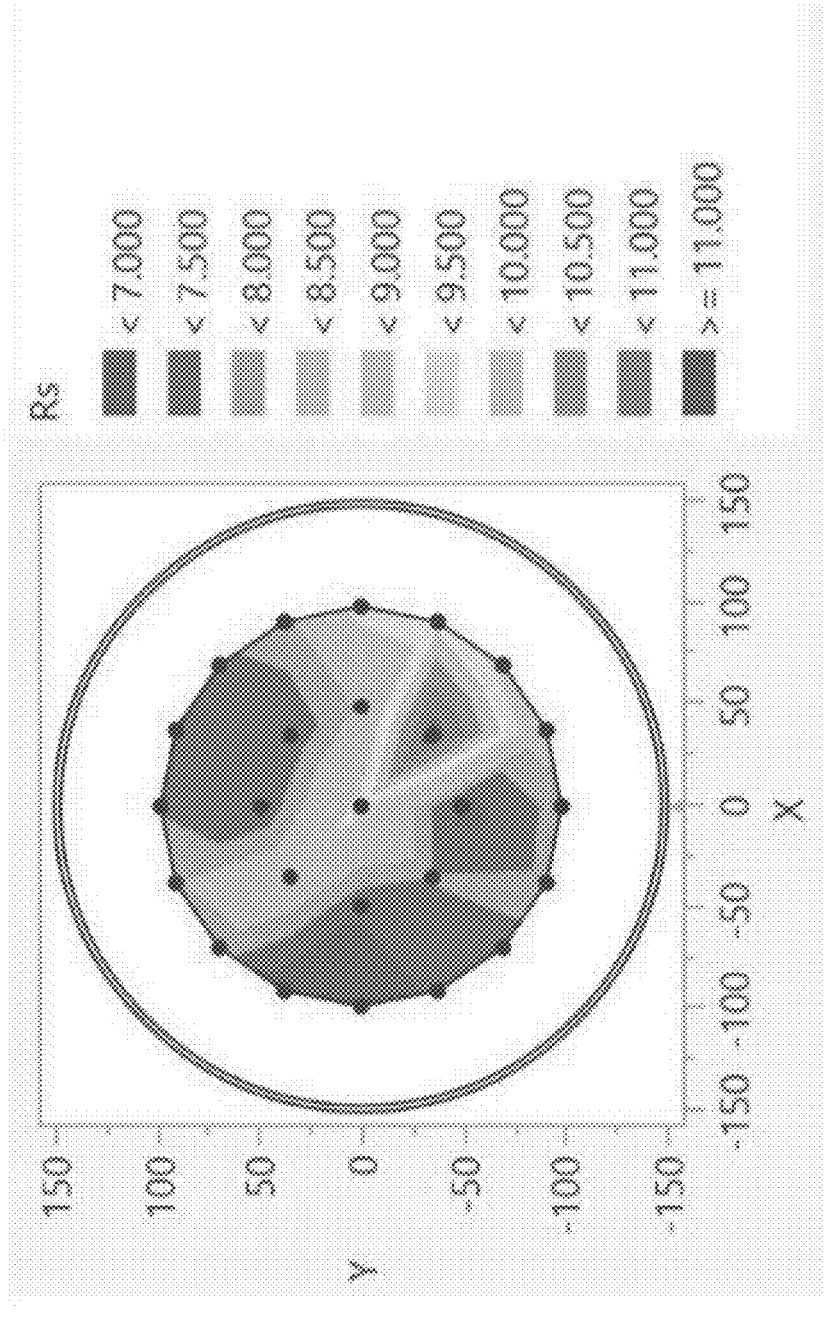
FIG. 2 illustrates an example diagram of a substrate sheet resistivity according to some embodiments herein.

FIG. 2 illustrates an example diagram of a substrate sheet resistivity according to some embodiments herein. In some embodiments, a substrate may undergo a surface clean treatment, followed by a two-step deposition of an Mo-containing film. In some embodiments, the surface clean treatment and an initial low-temperature deposition may remove oxides from the surface of the substrate and protect the exposed surface from damage during deposition. As a result, a low resistivity film may be formed on the surface.

Figure 3:
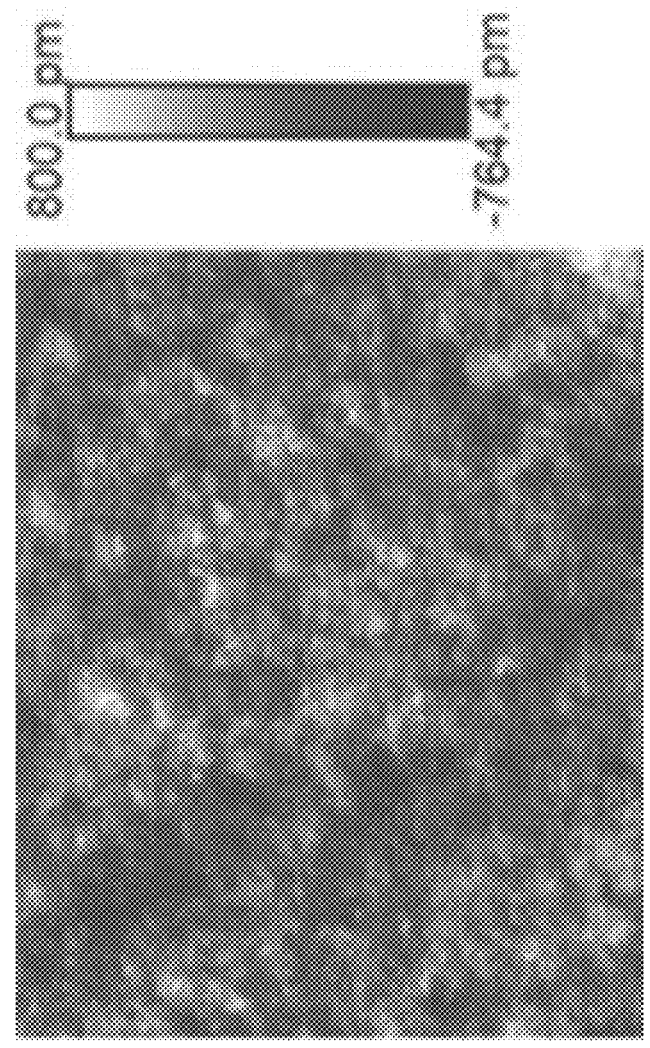
FIG. 3 illustrates a microscopic image of a substrate surface processed according to some embodiments herein.

FIG. 3 illustrates a microscopic image of a substrate surface processing according to the embodiments herein. In some embodiments, an initial low temperature deposition step is utilized, in which a Mo-halide reactant is contacted with a substrate at a temperature below 400° C. to form at least one film layer. This initial low temperature deposition protects the substrate surface from damage that may occur using a one-step deposition at high temperatures.

Reaction Chamber

Figure 4:
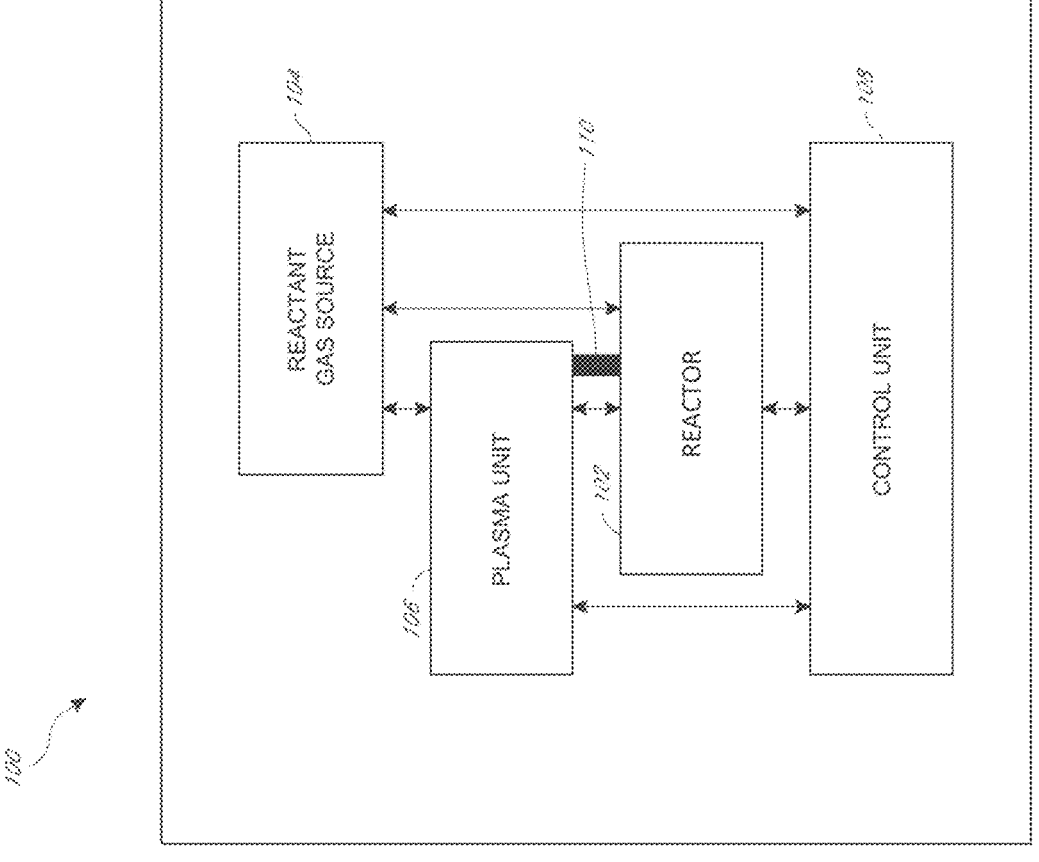
FIG. 4 is a schematic diagram of an example substrate processing apparatus, according to some embodiment herein.

FIG. 4 is a schematic diagram of an example substrate processing apparatus, according to some embodiments herein. FIG. 1 shows a schematic diagram of a substrate processing apparatus 100 for pre-cleaning a surface of a substrate and performing deposition on the surface, according to some embodiments. The substrate processing apparatus 100 may include a reactor 102, which may comprise one or more reaction chambers. Reactor 102, a reactant gas source 104, a plasma unit 106 and a control unit 108. The reactor 102 may comprise any reactor or reaction chamber described above, such as a single-wafer reactor or a batch reactor, as well as a single reaction chamber reactor or multi-reaction chamber reactor. The reactor 102 may be configured to perform the methods described herein and may comprise one or more reaction chamber to receive the substrate. The reactant gas source 104 may be configured to supply one or more components of the reactant gases. For example, reactant gas source 104 may include one or more containers, each containing a reactant gas or a component of a reactant gas. The plasma unit 104 may comprise a plasma generator configured to activate one or more components of the reactant gas. In some embodiments, the plasma unit 106 comprises a remote plasma unit. The reactant gas source 104 may be in fluid communication with the plasma unit 106 such that one or more components of the reactant gas may be activated by the plasma unit 106 before being introduced into the reactor 102. The reactor 102 may be in fluid communication with either or both of the reactant gas source 104 and the plasma unit 106. Activated and/or unactivated components of the reactant gas may be flowed into the reactor 102. For example, both activated and unactivated reactant gas components may be flowed into the reactor 102 simultaneously or sequentially. The control unit 108 can be configured to control one or more parameters of the cleaning and deposition processes described herein. In some embodiments, the control unit 108 can be in electrical communication with one or more of the reactor 102, the reactant gas source 104, and the plasma unit 106. For example, the control unit 108 may communicate with the plasma unit 106 to control an operating power of the plasma unit 106, with the reactant gas source 104 to control a flow of reactant gas from the reactant gas source 104, and/or with the reactor 102 to control one or more process conditions. The control unit 108 may include one or more processors, memory devices, and other electronic components that control the operation of various components of the substrate processing apparatus 100. As used herein, the term "control unit" includes any combination of individual controller devices and processing electronics that may be integrated with or connected to other devices (such as valves, sensors, etc.). Thus, in some embodiments, the control unit 108 may include a centralized controller that controls the operation of multiple (or all) system components. In some embodiments, the control unit 108 may include a plurality of distributed controllers that control the operation of one or more system components. Control sequences may be hardwired or programmed into the control unit 108. The memory devices of the control unit 108 include non-transitory computer-readable medium, such as physical computer storage including hard drives, solid state memory, random access memory (RAM), read only memory (ROM), optical disc, volatile or non-volatile storage, combinations of the same and/or the like. The non-transitory computer-readable medium provides instructions to the one or more processors. It will be appreciated that the instructions may be for any of the actions described herein, such that processing of the instructions by the one or more processors causes the substrate processing apparatus 100 to perform those actions.

In some embodiments, the reactor 102 can be in fluid communication with the remote plasma unit 106 through a transfer tube 110. The transfer tube 110 can be configured to deliver a reactant gas into the reactor 102 (e.g., a reactant gas comprising an oxygen-free molybdenum halide) via a reaction chamber gas inlet for the reactor 102. In some embodiments, the transfer tube 110 can include a transfer tube gas inlet configured to allow introduction into the reaction chamber of one or more components of the reactant gas which is not activated by the remote plasma unit. The transfer tube 110 gas inlet may be located proximate to the reaction chamber gas inlet, or at another suitable location on the transfer tube 110. In some embodiments, at least a portion of the transfer tube 110 can be maintained at a desired temperature. For example, a portion of the transfer tube 110 may be heated, including the portion of the transfer tube 110 adjacent to and/or surrounding the portion between the transfer tube gas inlet and the reaction chamber gas inlet. In some embodiments, the entire length or substantially the entire length of the transfer tube 110 is maintained at a desired temperature.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than restrictive sense.

Indeed, although this invention has been disclosed in the context of certain embodiments and examples, it will be understood by those skilled in the art that the invention extends beyond the specifically disclosed embodiments to other alternative embodiments and/or uses of the invention and obvious modifications and equivalents thereof. In addition, while several variations of the embodiments of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the embodiments of the disclosed invention. Any methods disclosed herein need not be performed in the order recited. Thus, it is intended that the scope of the invention herein disclosed should not be limited by the particular embodiments described above.

It will be appreciated that the systems and methods of the disclosure each have several innovative aspects, no single one of which is solely responsible or required for the desirable attributes disclosed herein. The various features and processes described above may be used independently of one another, or may be combined in various ways. All possible combinations and subcombinations are intended to fall within the scope of this disclosure.

Certain features that are described in this specification in the context of separate embodiments also may be implemented in combination in a single embodiment. Conversely, various features that are described in the context of a single embodiment also may be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination. No single feature or group of features is necessary or indispensable to each and every embodiment.

It will also be appreciated that conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. In addition, the term "or" is used in its inclusive sense (and not in its exclusive sense) so that when used, for example, to connect a list of elements, the term "or" means one, some, or all of the elements in the list. In addition, the articles "a," "an," and "the" as used in this application and the appended claims are to be construed to mean "one or more" or "at least one" unless specified otherwise. Similarly, while operations may be depicted in the drawings in a particular order, it is to be recognized that such operations need not be performed in the particular order shown or in sequential order, or that all illustrated operations be performed, to achieve desirable results. Further, the drawings may schematically depict one more example processes in the form of a flowchart. However, other operations that are not depicted may be incorporated in the example methods and processes that are schematically illustrated. For example, one or more additional operations may be performed before, after, simultaneously, or between any of the illustrated operations. Additionally, the operations may be rearranged or reordered in other embodiments. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products. Additionally, other embodiments are within the scope of the following claims. In some cases, the actions recited in the claims may be performed in a different order and still achieve desirable results.

Further, while the methods and devices described herein may be susceptible to various modifications and alternative forms, specific examples thereof have been shown in the drawings and are herein described in detail. It should be understood, however, that the invention is not to be limited to the particular forms or methods disclosed, but, to the contrary, the invention is to cover all modifications, equivalents, and alternatives falling within the spirit and scope of the various implementations described and the appended claims. Further, the disclosure herein of any particular feature, aspect, method, property, characteristic, quality, attribute, element, or the like in connection with an implementation or embodiment can be used in all other implementations or embodiments set forth herein. Any methods disclosed herein need not be performed in the order recited. The methods disclosed herein may include certain actions taken by a practitioner; however, the methods can also include any third-party instruction of those actions, either expressly or by implication. The ranges disclosed herein also encompass any and all overlap, sub-ranges, and combinations thereof. Language such as "up to," "at least," "greater than," "less than," "between," and the like includes the number recited. Numbers preceded by a term such as "about" or "approximately" include the recited numbers and should be interpreted based on the circumstances (e.g., as accurate as reasonably possible under the circumstances, for example ±5%, ±10%, ±15%, etc.). For example, "about 3.5 mm" includes "3.5 mm." Phrases preceded by a term such as "substantially" include the recited phrase and should be interpreted based on the circumstances (e.g., as much as reasonably possible under the circumstances). For example, "substantially constant" includes "constant." Unless stated otherwise, all measurements are at standard conditions including temperature and pressure.

As used herein, a phrase referring to "at least one of" a list of items refers to any combination of those items, including single members. As an example, "at least one of: A, B, or C" is intended to cover: A, B, C, A and B, A and C, B and C, and A, B, and C. Conjunctive language such as the phrase "at least one of X, Y and Z," unless specifically stated otherwise, is otherwise understood with the context as used in general to convey that an item, term, etc. may be at least one of X, Y or Z. Thus, such conjunctive language is not generally intended to imply that certain embodiments require at least one of X, at least one of Y, and at least one of Z to each be present. The headings provided herein, if any, are for convenience only and do not necessarily affect the scope or meaning of the devices and methods disclosed herein.

Accordingly, the claims are not intended to be limited to the embodiments shown herein, but are to be accorded the widest scope consistent with this disclosure, the principles and the novel features disclosed herein.

What is claimed is:

1. A method for thin film deposition, the method comprising:

providing a substrate in a reactor;

performing a surface clean on a surface of the substrate, wherein the surface clean comprises removing a surface oxide from the surface of the substrate by contacting the surface with an etchant;

after the step of removing the surface oxide, exposing the substrate to a plasma comprising $H_2$ and Ar;

performing a deposition process comprising:

a) contacting the surface of the substrate in the reactor with a first oxygen-free molybdenum halide reactant at a first temperature, wherein contacting with the first oxygen-free molybdenum halide reactant forms at least one layer of molybdenum on the substrate;

b) raising the temperature of the reactor from the first temperature to a second temperature;

c) contacting the substrate in the reactor with a second oxygen-free molybdenum halide reactant at the second temperature, wherein contacting with the second oxygen-free molybdenum halide reactant forms at least one layer of molybdenum on the substrate; and optionally, repeating step c) until a molybdenum-containing film of desired thickness is formed, wherein the temperature of the reactor is raised while the substrate is contacted with the first oxygen-free molybdenum halide reactant and/or the second oxygen-free molybdenum halide reactant.

2. The method of claim 1, wherein the first oxygen-free molybdenum halide reactant and the second oxygen-free molybdenum halide reactant comprise $MoCl_5$.

3. The method of claim 2, wherein $MoCl_5$ is continuously flowed into the reactor during the deposition process.

4. The method of claim 1, wherein the deposition process further comprises ceasing contacting the surface of the substrate in the reactor with the first oxygen-free molybdenum halide reactant prior to raising the temperature of the reactor from the first temperature to the second temperature.

5. The method of claim 1, wherein the surface clean further comprise removing an etchant residue from the surface.

6. The method of claim 1, wherein the surface of the substrate is contacted with the first oxygen-free molybdenum halide reactant in a first reaction chamber of the reactor and contacted with the second oxygen-free molybdenum halide reactant in a second reaction chamber of the reactor, wherein the first reaction chamber is in gas isolation from the second reaction chamber.

7. The method of claim 1, wherein the molybdenum-containing film of desired thickness comprises a resistivity of less than about 50 μΩcm.

8. The method of claim 1, wherein the molybdenum-containing film of desired thickness comprises a three-dimensional structure having at least 90% conformality.

9. The method of claim 1, wherein the molybdenum-containing film of desired thickness forms a structure having an aspect ratio of more than about 3:1 and wherein the film has step coverage of more than about 80%.

10. The method of claim 1, wherein the first temperature is less than 400° C.

11. The method of claim 10, wherein the second temperature is greater than 450° C.

12. The method of claim 1, wherein the deposition process comprises atomic layer deposition (ALD) on the substrate.

13. The method of claim 1, wherein the molybdenum-containing film of desired thickness comprises a source or drain contact structure of a field effect transistor.

14. The method of claim 1, wherein the surface comprises silicon, germanium, or silicon germanium.

15. The method of claim 1, wherein the repeating step c) is by using temporally spaced reactant pulses.

16. The method of claim 1, wherein the removing the surface oxide from the surface of the substrate is by contacting the surface with one or more of Ar, TT, $NH_3$, and $NF_3$.

17. The method of claim 1, wherein the ratio of $H_2$ to Ar is between 1:10 and 1:5.

18. The method of claim 5, wherein the removing an etchant residue comprises evaporation.

19. A substrate processing system, comprising:

a reaction chamber for accommodating one or more substrates;

a control unit comprising one or more processors and non-transitory computer-readable media storing instructions for controlling the substrate processing system, wherein the instructions, when executed by the one or more processors, cause the substrate processing system to:

provide a substrate in the reactor;

perform a surface clean of a surface of the substrate, wherein the surface clean comprises removing a surface oxide from the surface of the substrate by contacting the surface with an etchant;

after the step of removing the surface oxide, expose the substrate to a plasma comprising $H_2$ and Ar;

perform a deposition process comprising:

a) contact the surface of the substrate in the reactor with a first oxygen-free molybdenum halide reactant at a first temperature, wherein said contacting with the first oxygen-free molybdenum halide reactant forms at least one layer of molybdenum on the substrate;

b) raise the temperature of the reactor from the first temperature to a second temperature;

c) contact the substrate in the reactor with a second oxygen-free molybdenum halide reactant at the second temperature, wherein said contacting with the second oxygen-free molybdenum halide reactant forms at least one layer of molybdenum on the substrate, wherein the second temperature is higher than the first temperature; and repeat step c) until a molybdenum-containing film of desired thickness is formed, wherein the temperature of the reactor is raised while the substrate is contacted with the first oxygen-free molybdenum halide reactant and/or the second oxygen-free molybdenum halide reactant.

* * * * *